(12) United States Patent
Watanabe

(10) Patent No.: US 8,492,864 B2
(45) Date of Patent: Jul. 23, 2013

(54) SOLID-STATE IMAGING DEVICE AND ELECTRONIC EQUIPMENT

(75) Inventor: Kazufumi Watanabe, Kumamoto (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/252,618

(22) Filed: Oct. 4, 2011

(65) Prior Publication Data

US 2012/0086094 A1 Apr. 12, 2012

(30) Foreign Application Priority Data

Oct. 12, 2010 (JP) .................. 2010-229753

(51) Int. Cl.
*H01L 27/146* (2006.01)

(52) U.S. Cl.
USPC ............. 257/435; 257/E27.151; 257/E31.127

(58) Field of Classification Search
CPC .......... H01L 27/14623; H01L 27/14685; H01L 31/02164
USPC ................... 257/432, 435, E27.151, E31.127
See application file for complete search history.

(56) References Cited

U.S. PATENT DOCUMENTS

| 2004/0075761 A1* | 4/2004 | Maeda et al. | 348/340 |
| 2005/0104148 A1* | 5/2005 | Yamamoto et al. | 257/432 |
| 2008/0237766 A1* | 10/2008 | Kim | 257/432 |
| 2011/0024858 A1* | 2/2011 | Yoshihara et al. | 257/432 |

FOREIGN PATENT DOCUMENTS

JP 2005-285814 10/2005

* cited by examiner

*Primary Examiner* — Nikolay Yushin
(74) *Attorney, Agent, or Firm* — Dentons US LLP

(57) ABSTRACT

A solid-state imaging device includes: a substrate; a wiring layer formed on a front side of the substrate in which pixels are formed; a surface electrode pad section formed in the wiring layer; a light-shielding film formed on a rear side of the substrate; a pad section base layer formed in the same layer as the light-shielding film; an on-chip lens layer formed over the light-shielding film and the pad section base layer in a side opposite from the substrate side; a back electrode pad section formed above the on-chip lens layer; a through-hole formed to penetrate the on-chip lens layer, the pad section base layer, and the substrate so as to expose the surface electrode pad section; and a through-electrode layer which is formed in the through-hole and connects the surface electrode pad section and the back electrode pad section.

12 Claims, 13 Drawing Sheets

SOLID-STATE IMAGING DEVICE AND ELECTRONIC EQUIPMENT

BACKGROUND

The present disclosure relates to a back irradiation type solid-state imaging device, a manufacturing method thereof, and electronic equipment using the solid-state imaging device.

In the past, as a solid-state imaging device which is used in a digital camera or a video camera, a CCD type solid-state imaging device or a CMOS type solid-state imaging device has been known. In these solid-state imaging devices, a light sensing section is formed for each pixel of a plurality of pixels formed in a two-dimensional matrix form, and in the light sensing section, a signal charge is produced depending on the amount of received light. Then, the signal charge produced in the light sensing section is transmitted and amplified, whereby an image signal is obtained.

Further, in recent years, a back irradiation type solid-state imaging device has been proposed which is irradiated with light from the opposite side to the side on a substrate on which a wiring layer is formed. In the back irradiation type solid-state imaging device, since a wiring layer, a circuit element, or the like is not provided on the light irradiation side, the aperture ratio of the light sensing section formed in a substrate can be increased and in addition, since incident light is incident on the light sensing section without being reflected by the wiring layer or the like, improvement in sensitivity can be attained.

Incidentally, in the back irradiation type solid-state imaging device, in order to draw out an electrode pad of the wiring layer formed on the surface side of the substrate to the back side that is the light irradiation side of the substrate, a through-hole which penetrates the substrate from the light irradiation surface of the substrate and exposes the electrode pad is formed. In manufacturing methods of a solid-state imaging device in the past, such a through-hole is formed after or before formation of an on-chip lens which is formed on the light incidence plane side of the substrate.

In Japanese Unexamined Patent Application Publication No. 2005-285814, in the back irradiation type solid-state imaging device, a configuration is described in which an on-chip lens is formed after formation of the through-hole in which the electrode pad is exposed. In this manner, in a case where the on-chip lens is formed after formation of the through-hole, there is a problem in that application unevenness of a resist material at the time of formation of the on-chip lens is generated due to the influence of the through-hole, so that the shape of the on-chip lens becomes non-uniform in a plane. In a case where the shape of the on-chip lens is non-uniform, there is concern that variation in light condensing characteristic may be generated in a chip.

Further, in a case where an electrode layer is formed on the back side of the substrate after formation of the on-chip lens, the probability of a change in the shape of the on-chip lens due to patterning of the electrode layer, or cohesion of scattering particle constituents due to a difference in etching of the electrode layer onto the on-chip lens is high. For this reason, in a case where the electrode layer is formed on the back side of the substrate after formation of the on-chip lens, there is concern that a defect due to the particle constituents may be generated.

Further, as in Japanese Unexamined Patent Application Publication No. 2005-285814, in a case where from the back side of the substrate, a bonding wire is connected to the electrode pad formed on the surface side of the substrate, it is necessary to insert the bonding wire into the through-hole which penetrates the substrate. For this reason, connection to an external terminal by the bonding wire is difficult, so that there is concern that yield at the time of assembly may be reduced.

SUMMARY

It is desirable to provide a solid-state imaging device in which an on-chip lens is accurately formed and improvement in yield at the time of assembly can be attained. Further, it is desirable to provide electronic equipment using the solid-state imaging device.

According to an embodiment of the present disclosure, there is provided a solid-state imaging device including: a substrate, a wiring layer, a surface electrode pad section, a light-shielding film, a pad section base layer, an on-chip lens layer, a through-hole, a back electrode pad section, and a through-electrode layer. In the substrate, a plurality of pixels including a photoelectric conversion section is formed. The wiring layer is formed on a front side of the substrate. The surface electrode pad section is formed in the wiring layer. The light-shielding film is formed on a rear side of the substrate. The pad section base layer is formed in the same layer as the light-shielding film. The on-chip lens layer is formed over the light-shielding film and the pad section base layer in a side opposite from the substrate side. The back electrode pad section is formed above the on-chip lens layer. The through-hole is formed to penetrate the on-chip lens layer, the pad section base layer, and the substrate so that the surface electrode pad section is exposed. The through-electrode layer is formed so as to connect the surface electrode pad section and the back electrode pad section through the through-hole.

In the solid-state imaging device according to the embodiment of the present disclosure, the surface electrode pad section formed in the wiring layer on the surface side of the substrate is drawn out to the back side of the substrate by the through-electrode layer formed in the through-hole and the back electrode pad section formed on the back side of the substrate. That is, since it is possible to form the back electrode pad section on an upper layer of the substrate, it is possible to easily perform bonding.

According to another embodiment of the present disclosure, there is provided a method of manufacturing a solid-state imaging device, including: forming a plurality of pixels which are each provided with a photoelectric conversion section that produces a signal charge according to the amount of received light, in a substrate, and forming a wiring layer having wirings of plural layers and a surface electrode pad section, on the surface side of the substrate. Further, the method includes forming a pad section base layer and a light-shielding film in the same layer on the wiring layer, and forming an on-chip lens layer on the light incidence side of an upper layer on the opposite side to the substrate side of the pad section base layer and the light-shielding film. Further, the method includes forming a through-hole which penetrates the pad section base layer from above the on-chip lens layer and reaches the surface electrode pad section, and forming a through-electrode layer in the through-hole and also forming a back electrode pad section electrically connected to the surface electrode pad section, on the on-chip lens layer. Further, the method includes processing the surface of the on-chip lens layer above the pixel into a convex shape, thereby forming an on-chip lens.

According to still another embodiment of the present disclosure, there is provided a method of manufacturing a solid-state imaging device, including: laminating an upper layer section which is constituted by a substrate and a wiring layer and a lower layer section which is formed constituted by a substrate and a wiring layer in the same way, by adhering the wiring layers of the upper layer section and the lower layer section to each other. In the substrate constituting the upper layer section, a plurality of pixels which are each provided with a photoelectric conversion section that produces a signal charge according to the amount of received light are formed. Further, the wiring layer is formed on the surface side of the substrate. Further, a light-shielding film is formed on the back side of the substrate and a pad section base layer is formed in the same layer as the light-shielding film. Further, an on-chip lens layer is formed on the light incidence side of an upper layer on the opposite side to the substrate side of the light-shielding film and the pad section base layer. Further, a surface electrode pad section is formed in the wiring layer of the lower layer section. Then, the method includes forming a through-hole which penetrates the pad section base layer from above the on-chip lens layer and reaches the surface electrode pad section, after the upper layer section and the lower layer section are laminated. Further, the method includes forming a through-electrode layer in the through-hole and also forming a back electrode pad section electrically connected to the surface electrode pad section on the on-chip lens layer, and processing the surface of the on-chip lens layer above the pixel, thereby forming an on-chip lens.

In the methods of manufacturing a solid-state imaging device according to the above embodiments of the present disclosure, after formation of the on-chip lens layer, the through-hole which exposes the surface electrode pad section formed in the wiring layer is formed from the light incidence side of the substrate. In this way, since the on-chip lens layer is formed without being affected by unevenness due to the through-hole, application unevenness is reduced. Further, the processing of the on-chip lens is performed after formation of the through-electrode layer and the back electrode pad section. Accordingly, retention of scattering metal which is generated at the time of formation of the through-electrode layer and the back electrode pad section, or occurrence of shape collapse of the on-chip lens is suppressed.

According to further still another embodiment of the present disclosure, there is provided electronic equipment including: an optical lens, a solid-state imaging device on which light condensed by the optical lens is incident, and a signal processing circuit which processes an output signal that is output from the solid-state imaging device. Then, the solid-state imaging device includes a substrate, a wiring layer, a surface electrode pad section, a light-shielding film, a pad section base layer, an on-chip lens layer, a back electrode pad section, a through-hole, and a through-electrode layer. In the substrate, a plurality of pixels which are each provided with a photoelectric conversion section that produces a signal charge according to the amount of received light are formed. The wiring layer is formed on the surface side of the substrate. The surface electrode pad section is formed in the wiring layer. The light-shielding film is formed on the back side of the substrate. The pad section base layer is formed in the same layer as the light-shielding film. The on-chip lens layer is formed on the light incidence side of an upper layer on the opposite side to the substrate side of the light-shielding film and the pad section base layer. The back electrode pad section is formed above the on-chip lens layer. The through-hole is formed to penetrate the on-chip lens layer, the pad section base layer, and the substrate so that the surface electrode pad section is exposed. The through-electrode layer is formed so as to connect the surface electrode pad section and the back electrode pad section through the through-hole.

According to the embodiments of the present disclosure, a solid-state imaging device can be obtained in which the light condensing characteristic of the on-chip lens is improved and improvement in yield at the time of assembly can be attained. Further, by using the solid-state imaging device, electronic equipment can be obtained in which improvement in image quality can be attained.

DETAILED DESCRIPTION OF EMBODIMENTS

Hereinafter, solid-state imaging devices and one example of electronic equipment related to embodiments of the present disclosure will be described with reference to FIGS. 1 to 16. The embodiments of the present disclosure will be described in the following order. In addition, the present disclosure is not limited to the following examples.

1. First Embodiment: Example of a back irradiation type solid-state imaging device of CMOS type
   1-1 Overall Configuration
   1-2 Configuration of Main Section
   1-3 Manufacturing Method
2. Second Embodiment: Example of a back irradiation type solid-state imaging device of CMOS type
3. Third Embodiment: Example of a back irradiation type solid-state imaging device of CMOS type
4. Fourth Embodiment: Example of a back irradiation type solid-state imaging device of CMOS type
5. Fifth Embodiment: Example of a back irradiation type solid-state imaging device of CMOS type
6. Sixth Embodiment: Electronic equipment

1. First Embodiment

Example of a Back Irradiation Type Solid-state Imaging Device of CMOS Type

A solid-state imaging device related to the first embodiment of the present disclosure will be described. This embodiment example is an example of a back irradiation type solid-state imaging device of CMOS type.

1-1 Overall Configuration

Figure 1:
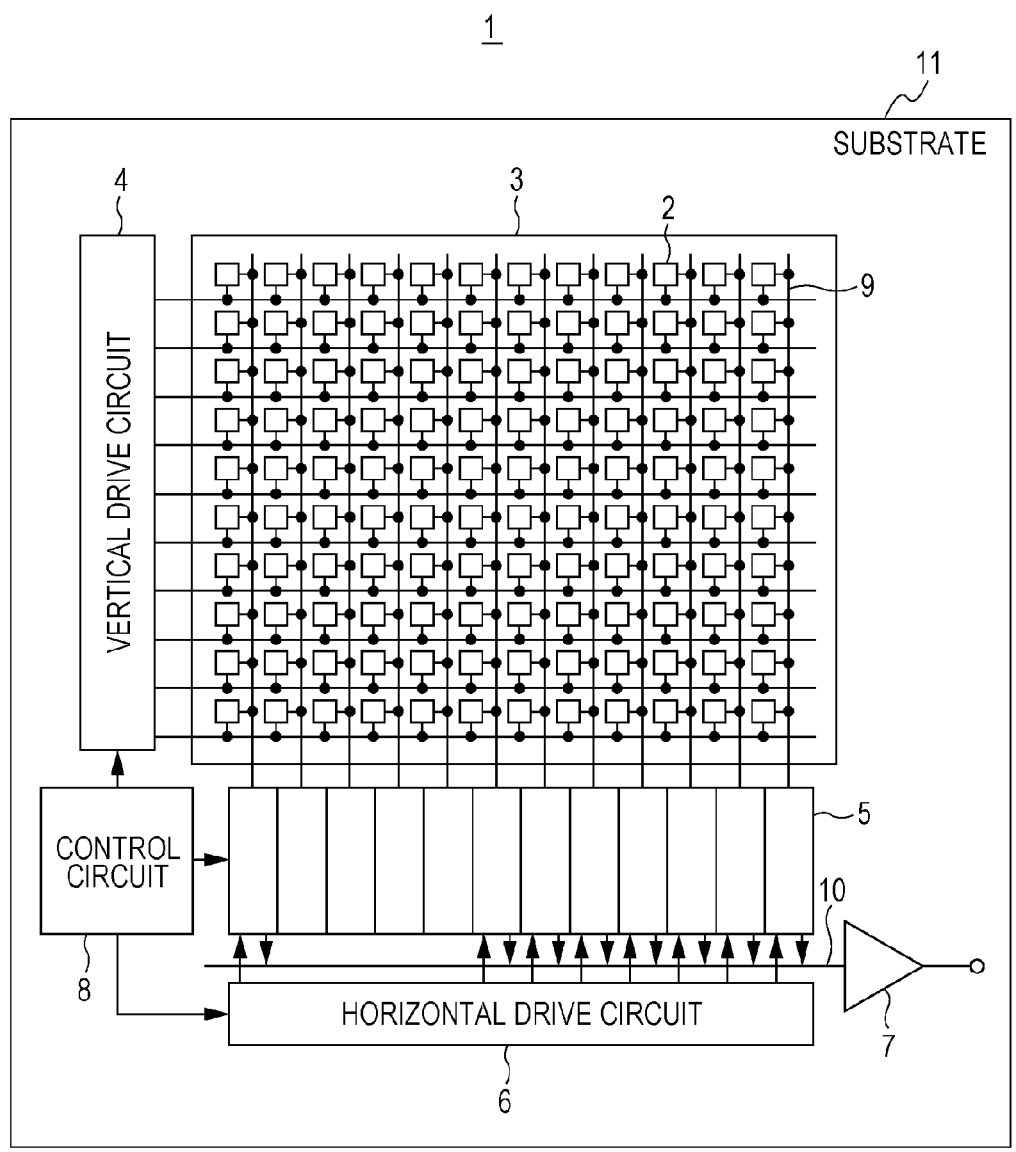
FIG. 1 is a schematic configuration diagram illustrating the entirety of a solid-state imaging device related to a first embodiment of the present disclosure.

First, before explanation of the configuration of the main section, the overall configuration of the solid-state imaging device of this embodiment example will be described. FIG. 1 is a schematic configuration diagram illustrating the entirety of the solid-state imaging device related this embodiment example.

A solid-state imaging device 1 includes an imaging region 3 which includes a plurality of pixels 2, a vertical drive circuit 4, a column signal processing circuit 5, a horizontal drive circuit 6, an output circuit 7, a control circuit 8, and the like on a substrate 11 made of silicon, as shown in FIG. 1.

The pixel 2 is constituted by a light sensing section which includes a photodiode that produces a signal charge in accordance with the amount of received light, and a plurality of MOS transistors for reading out and transmitting the signal charge, and a plurality of pixels 2 are regularly arranged in the form of a two-dimensional array on the substrate 11.

The imaging region 3 is constituted by the plurality of pixels 2 regularly arranged in the form of a two-dimensional array. The imaging region 3 includes an effective pixel region which can actually receive light and accumulate the signal charge produced by photoelectric conversion, and an invalid pixel region (hereinafter referred to as an optical black region) which is formed around the effective pixel region and is for outputting optical black which becomes a standard of a black level.

The control circuit 8 produces a clock signal, a control signal, or the like, which becomes the standard of an operation of each of the vertical drive circuit 4, the column signal processing circuit 5, the horizontal drive circuit 6, and the like, on the basis of a vertical synchronization signal, a horizontal synchronization signal, a master clock. Then, the clock signal, the control signal, or the like produced in the control circuit 8 is input to the vertical drive circuit 4, the column signal processing circuit 5, the horizontal drive circuit 6, and the like.

The vertical drive circuit 4 is constituted, for example, by a shift register and sequentially selects and scans each pixel 2 of the imaging region 3 in a row unit in a vertical direction. Then, a pixel signal based on a signal charge produced in a photoelectric conversion element of each pixel 2 is supplied to the column signal processing circuit 5 through a vertical signal line 9.

The column signal processing circuit 5 is disposed, for example, for each column of the pixels 2 and performs signal processing such as denoising or signal amplification for each pixel column on signals which are output from the pixels 2 for one row, by a signal from the optical black region (although it is not shown in the drawing, it is formed around the effective pixel region). At an output stage of the column signal processing circuit 5, a horizontal selection switch (not shown) is provided between the output stage and a horizontal signal line 10.

The horizontal drive circuit 6 is constituted, for example, by a shift register and selects in order each of the column signal processing circuits 5 by sequentially outputting a horizontal scanning pulse, thereby making a pixel signal be output from each of the column signal processing circuits 5 to the horizontal signal line 10.

The output circuit 7 performs signal processing on the pixel signal which is sequentially supplied from each of the column signal processing circuits 5 through the horizontal signal line 10 and then outputs the processed signal.

1-2 Configuration of Main Section

Figure 2:
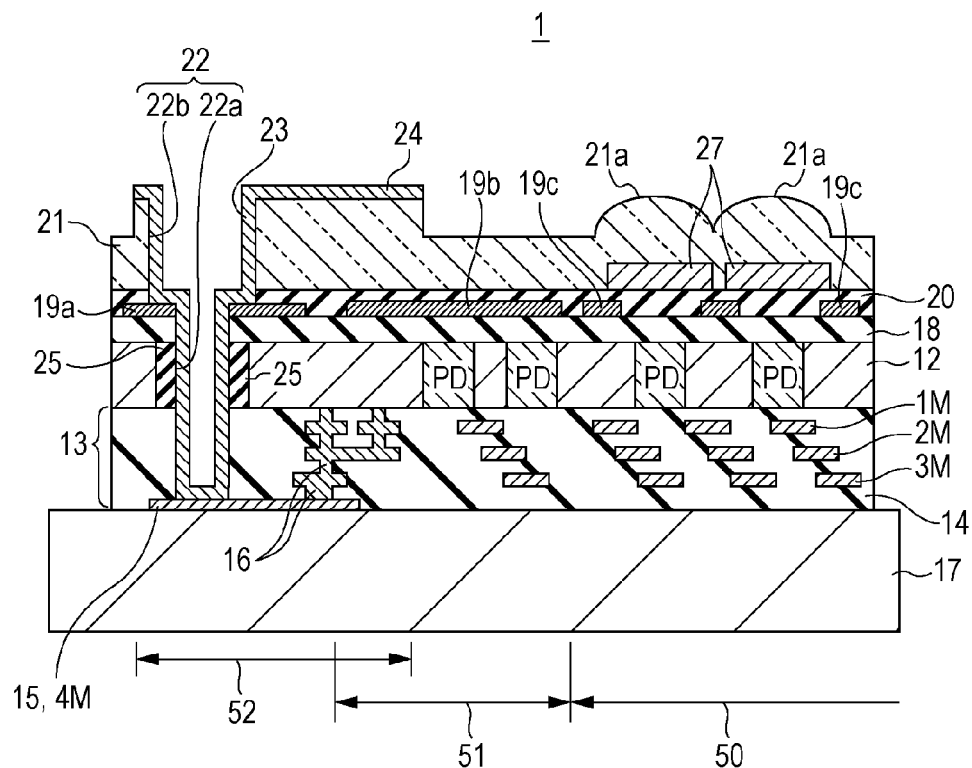
FIG. 2 is a cross-sectional configuration diagram of the main section of the solid-state imaging device related to the first embodiment of the present disclosure.

In FIG. 2, a cross-sectional configuration diagram of the main section of the solid-state imaging device 1 of this embodiment example is illustrated. The solid-state imaging device 1 of this embodiment example is an example of the back irradiation type solid-state imaging device of CMOS type, and FIG. 2 illustrates in cross-section an effective pixel region 50, an optical black region 51, and a pad region 52. Further, in this embodiment example, the pad region 52 is an example representing especially a ground wiring or a portion which is connected to a negative electric potential.

As shown in FIG. 2, the solid-state imaging device 1 of this embodiment example includes a substrate 12 and a wiring layer 13 formed on the surface side of the substrate 12. Further, the solid-state imaging device 1 includes an insulating film 18, a pad section base layer 19a, an invalid pixel light-shielding film 19b, and an inter-pixel light-shielding film 19c which are formed on the back side of the substrate 12, and a color filter layer 27 and an on-chip lens layer 21 which are formed above the above films and layer. Further, in the pad region 52, a surface electrode pad section 15, a through-hole 22, a back electrode pad section 24, and a through-electrode layer 23 are provided. Further, a support substrate 17 is attached to the surface on the opposite side to the substrate 12 side of the wiring layer 13.

The substrate 12 is constituted by a silicon semiconductor and formed to a thickness, for example, in a range of 2000 nm to 6000 nm. As shown in FIG. 1, in the imaging region 3 of the substrate 12, a plurality of pixels 2 are formed which each include a photoelectric conversion section and a plurality of pixel transistors (not shown). The photoelectric conversion section is constituted by a photodiode PD and produces a signal charge according to the amount of incident light from the back side of the substrate 12. Then, the signal charge produced in the photodiode PD is read out by the pixel transistor and output as a pixel signal. Further, although it is not shown in FIG. 2, a peripheral circuit which includes the vertical drive circuit 4 or the horizontal drive circuit 6 is formed in the substrate 12.

The wiring layer 13 is formed on the surface side which is the opposite side to the light incidence side of the substrate 12, and constituted by wirings 1M to 4M laminated into plural layers (in FIG. 2, four layers) with an interlayer insulating film 14 interposed therebetween. Desired wirings or the wirings 1M to 4M and the pixel transistor (not shown) are connected to each other by contact sections 16. In this way, the pixel transistor of each pixel 2 is driven from the wiring layer 13. Further, in the pad region 52, the surface electrode pad section 15 is formed by the fourth wiring 4M which is the topmost layer (in FIG. 2, a lower layer). As a constituent material of each of the wirings 1M to 4M constituting the wiring layer 13, for example, a metal material such as aluminum (Al) or copper (Cu) can be used. In this embodiment example, the first wiring 1M to the third wiring 3M are formed by copper and the fourth wiring 4M forming the surface electrode pad section 15 is formed by aluminum. Further, as a constituent material of the contact section 16, for example, a metal material such as tungsten or copper can be used. In addition, although in FIG. 2, the fourth wiring 4M is shown only as the surface electrode pad section 15, it can be used as a usual wiring in other regions.

The insulating film 18 is formed on the back side which becomes the light incidence side of the substrate 12, and formed into a single layer or plural layers. In a case where it is formed into plural layers, it can be formed, for example, in a three-layer structure which includes a silicon oxide film, a silicon oxynitride film, and a silicon nitride film formed in order on the back side of the substrate 12. In this case, an antireflection effect is obtained.

Further, as the insulating film 18, a film having a negative fixed charge may also be used. In this case, the insulating film 18 is formed in a three-layer structure which includes a silicon oxide, a high refractive index insulating film having a negative electric charge, and a silicon oxide film or a silicon nitride film in order from the substrate 12. Since a hole accumulation state of the interface between the substrate 12 and the insulation film 18 is enhanced by the high refractive index insulating film having a negative electric charge, it is advantageous for restraint of generation of a dark current.

Here, it is desirable that the high refractive index insulating film has a refractive index lower than or approximately equal to that of silicon and higher than that of a silicon oxide film.

A material film having a negative fixed charge is formed by, for example, an aluminum oxide ($Al_2O_3$) film, a zirconium oxide ($ZrO_2$) film, a hafnium oxide ($HfO_2$) film, a tantalum oxide ($Ta_2O_5$) film, or a titanium oxide ($TiO_2$) film. As a film formation method, a chemical vapor deposition method, a sputtering method, an atomic layer evaporation method, or the like can be given as an example. If the atomic layer evaporation method is used, it is preferable to simultaneously form a $SiO_2$ film, which reduces an interface level during film formation, by a thickness of about 1 nm. Further, as materials other than the above, lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), and the like can be given. Further, as the above material, samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), or the like can be given. Further, as the above material, holmium oxide ($Ho_2O_3$), thulium oxide ($Tm_2O_3$), ytterbium oxide ($Yb_2O_3$), lutetium oxide ($Lu_2O_3$), yttrium oxide ($Y_2O_3$), or the like can be given. Further, the film having a negative fixed charge can also be formed by a hafnium nitride film, an aluminum nitride film, a hafnium oxynitride film, or an aluminum oxynitride film.

In the film having a negative fixed charge, silicon (Si) or nitrogen (N) may also be added to the film within a range which does not impair an insulation property. The concentration thereof is appropriately determined within a range in which the insulation property of the film is not impaired. In this manner, by addition of silicon (Si) or nitrogen (N), it becomes possible to increase the heat resistance property of the film or the capability of blocking ion implantation during a process.

Although it varies depending on a material, it is preferable that the thickness of the insulating film 18 be in a range of 10 nm to 500 nm.

The pad section base layer 19a, the invalid pixel light-shielding film 19b, and the inter-pixel light-shielding film 19c are formed above the insulating film 18 on the opposite side to the side facing the substrate 12 of the insulating film 18 and formed in the same layer.

The inter-pixel light-shielding film 19c is formed between the adjacent pixels 2 and 2. Further, the invalid pixel light-shielding film 19b is formed in the optical black region 51. Further, the pad section base layer 19a is formed in the pad region 52. Further, although it will be described later, in this embodiment example, an example is taken in which the inter-pixel light-shielding film 19c, the invalid pixel light-shielding film 19b, and the pad section base layer 19a are electrically connected to each other.

As constituent materials of the pad section base layer 19a, the invalid pixel light-shielding film 19b, and the inter-pixel light-shielding film 19c, tungsten (W), aluminum (Al), titanium (Ti), or titanium nitride (TiN) can be used. Further, a laminated structure of TiN and Al formed in order in a lamination direction or a laminated structure of Ti and W can be taken. As for the film thickness of a base metal layer, it is acceptable if it is determined so as to have a light shielding property. Further, since the pad section base layer 19a is formed in the pad region 52 in which wire bonding is performed in an assembly process, it is desirable to select a material with a high hardness in consideration of bonding pressure. As the material with a high hardness, W, Ti, or TiN is typical.

The color filter layer 27 is formed above a planarization insulating film 20 made of an organic material or an inorganic material and formed to cover the pad section base layer 19a, the invalid pixel light-shielding film 19b, and the inter-pixel light-shielding film 19c, and formed corresponding to each pixel 2 of the effective pixel region 50. The color filter layer 27 is configured so as to selectively transmit light of, for example, green, red, blue, cyan, yellow, black, or the like in each pixel 2. Or, it can also be configured so as to transmit all lights such as white and not to transmit an infrared range. The color filter layer 27 which transmits different colors for each pixel 2 may also be used and the color filter layer 27 which transmits the same color in all the pixels 2 may also be used. With respect to the combination of colors in the color filter layer 27, various selections are possible according to the specification thereof.

The on-chip lens layer 21 is formed above the color filter layer 27, and in the effective pixel region 50, the surface of the on-chip lens layer 21 is formed into a convex shape for each pixel 2, so that an on-chip lens 21a is formed. Incident light is condensed by the on-chip lens 21a and efficiently incident on the photodiode PD of each pixel 2. As a constituent material of the on-chip lens layer 21, for example, an organic material having refractive index in a range of 1.0 to 1.3 can be used.

The through-hole 22 is constituted by a first opening portion 22a formed such that the surface electrode pad section 15 is exposed to the light incidence side, and a second opening portion 22b formed to have a larger diameter than the first opening portion 22a and formed such that the pad section base layer 19a is exposed to the light incidence side. That is, the through-hole 22 is formed to penetrate the on-chip lens layer 21, the pad section base layer 19a, and the substrate 12 in the pad region 52.

The back electrode pad section 24 is formed above the on-chip lens layer 21 of the pad region 52 and formed into a shape capable of being connected to an external terminal, and in this embodiment example, the back electrode pad section 24 is formed to extend up to the optical black region 51. That is, the back electrode pad section 24 is formed to extend up to just above the invalid pixel light-shielding film 19b.

The through-electrode layer 23 is formed along the inner wall of the through-hole 22 and electrically connects the surface electrode pad section 15 and the back electrode pad section 24. The back electrode pad section 24 and the through-electrode layer 23 are formed in the same process and by the same material. As constituent materials of the back electrode pad section and the through-electrode layer, it is preferable to use, for example, Al—Si—Cu-based alloy and besides, Al—Si-based alloy, Al, Al—Si—W-based alloy, or the like can also be used. With respect to the film thickness, a film thickness of 300 nm or more is necessary taking into account the rate of alloy at the time of later bonding.

Incidentally, since the second opening portion 22b is formed so as to expose the pad section base layer 19a, the through-electrode layer 23 and the pad section base layer 19a are electrically connected to each other. Accordingly, the surface electrode pad section 15, the pad section base layer 19a, and the back electrode pad section 24 are electrically connected to each other.

Further, in this embodiment example, as shown in FIG. 2, an insulating layer 25 formed by an impurity diffusion region is formed around the area of the substrate 12 in which the through-hole 22 is formed. For example, in a case where the substrate 12 is set to be an n-type and an electron is used as the signal charge, the insulating layer 25 can be formed by a p-type impurity diffusion region. Accordingly, a configuration is made in which the imaging region 3 or a peripheral circuit region formed in the substrate 12 is not electrically connected to the through-electrode layer 23.

1-3 Manufacturing Method

Next, a method of manufacturing the solid-state imaging device 1 of this embodiment example will be described. FIGS. 3 to 9B are diagrams illustrating manufacturing processes of the solid-state imaging device 1 of FIG. 2.

Here, a description is given from a process after the wiring layer 13 is formed on the surface of the substrate 12, the support substrate 17 is then bonded to an upper portion of the wiring layer 13, reverse is performed, and the substrate 12 is polished to a predetermined thickness. Therefore, in the cross-sectional configuration of FIG. 3, the photodiodes PD or the pixel transistors have already been formed in the substrate 12. Further, in the area corresponding to the pad region 52 of the substrate 12, the insulating layer 25 is formed by performing ion implantation of impurities of a predetermined conductivity type (in this embodiment example, a p-type). Since the manufacturing method so far can be formed using the same manufacturing method as that of a back irradiation type solid-state imaging device in the past, a detailed description is omitted.

Figure 3:
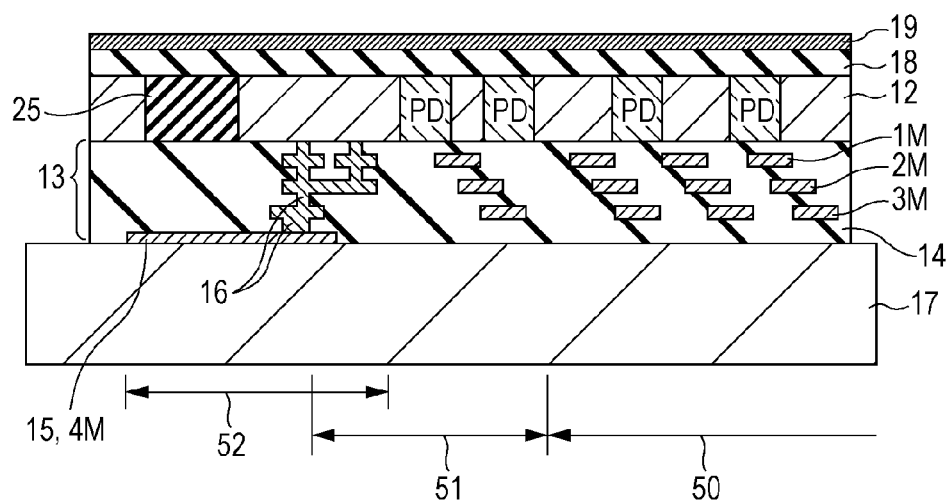
FIG. 3 is a manufacturing process diagram (Part 1) of the solid-state imaging device related to the first embodiment of the present disclosure.

After the substrate 12 is polished to a predetermined thickness, as shown in FIG. 3, the insulating film 18 constituted by a single layer or laminated layers is formed on the back side of the substrate 12. In a case where the insulating film 18 is made to be a laminated film, the insulating film 18 can be made in a laminated structure of a highly-refractive material and another insulating material. Further, as the highly-refractive material, it is preferable to use a material having a negative electric potential in order to increase a dark current suppression effect. Besides, as an insulating material constituting the insulating film 18, it is possible to use a silicon oxide film, a silicon nitride film, and a silicon oxynitride film, and these films are formed by a plasma CVD (chemical vapor deposition) method. Further, in a case where the insulating film 18 is formed of a film having a negative fixed charge, as described above, a CVD method, a sputtering method, an atomic layer evaporation method, or the like can be used. Thereafter, a base metal layer 19 is formed above the insulating film 18. The base metal layer 19 can be formed using a sputtering method or a CVD method.

Figure 4A:
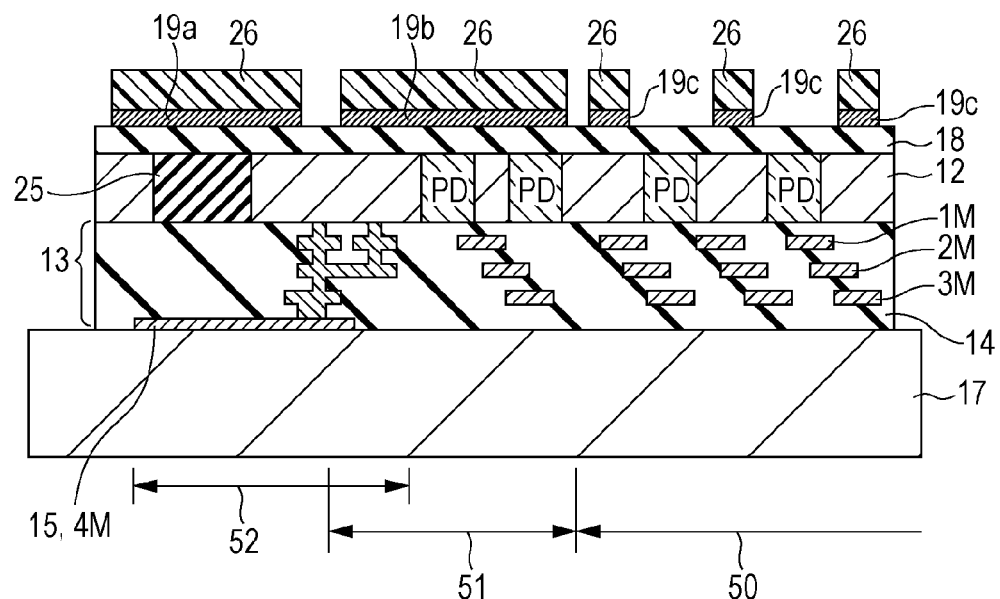
FIGS. 4A and 4B respectively are a cross-sectional configuration diagram (Part 2) illustrating a manufacturing process of the solid-state imaging device related to the first embodiment of the present disclosure and a diagram illustrating the schematic plane configurations of a pad section base layer, an invalid pixel light-shielding film, and an inter-pixel light-shielding film of the solid-state imaging device.
Figure 4B:
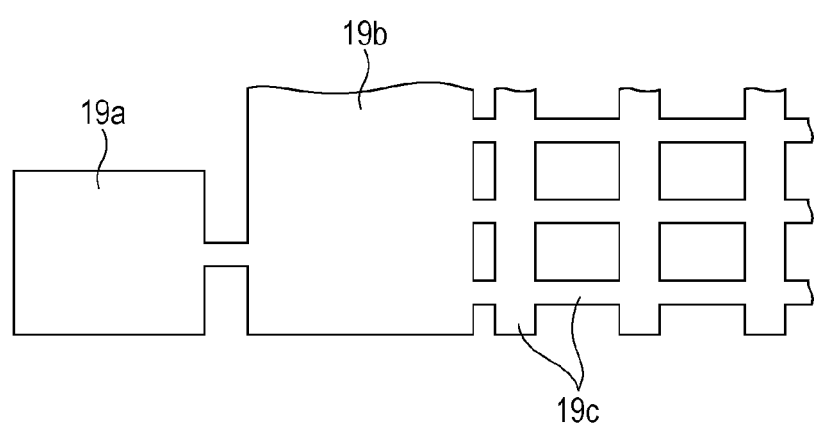

Next, as shown in FIG. 4A, a resist layer 26 is formed on the base metal layer 19 and they are shaped into a predetermined mask pattern by exposure and development. Thereafter, the pad section base layer 19a, the invalid pixel light-shielding film 19b, and the inter-pixel light-shielding film 19c are formed by performing etching with the resist layer 26 as a mask. FIG. 4B is a diagram illustrating the schematic plane configurations of the pad section base layer 19a, the invalid pixel light-shielding film 19b, and the inter-pixel light-shielding film 19c in FIG. 4A. As shown in FIG. 4B, the inter-pixel light-shielding film 19c is formed into a lattice shape such that portions above the photodiodes PD of the substrate 12 are opened, and the invalid pixel light-shielding film 19b is formed so as to shield the entire surface of the optical black region 51. Further, the pad section base layer 19a is formed so as to have a larger diameter than the second opening portion 22b which is formed in a later process. Then, in this embodiment example, the pad section base layer 19a, the invalid pixel light-shielding film 19b, and the inter-pixel light-shielding film 19c are formed to be electrically connected to each other.

Figure 5:
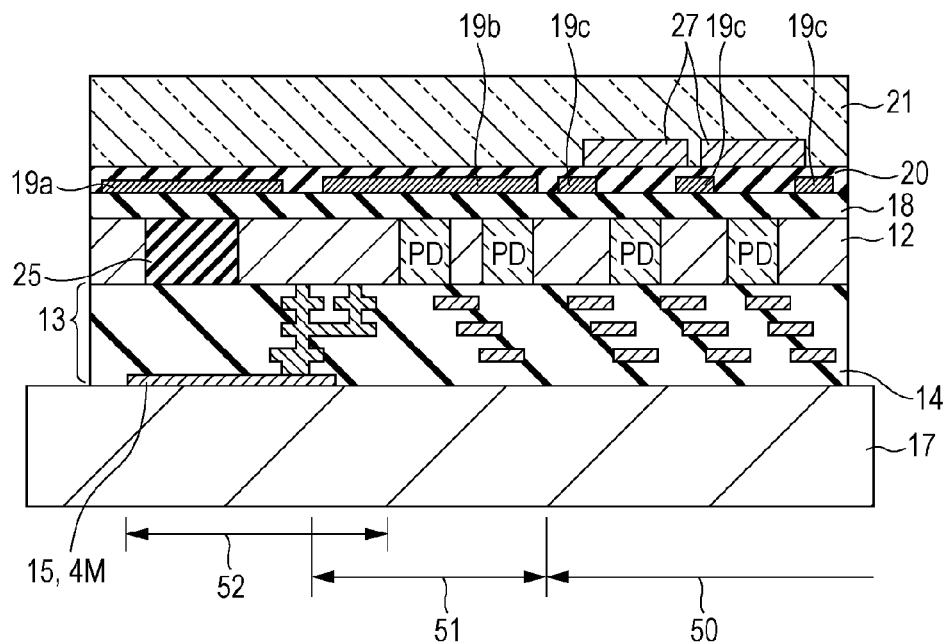
FIG. 5 is a manufacturing process diagram (Part 3) of the solid-state imaging device related to the first embodiment of the present disclosure.

Next, as shown in FIG. 5, the planarization insulating film 20 is formed so as to cover the pad section base layer 19a, the invalid pixel light-shielding film 19b, and the inter-pixel light-shielding film 19c. In a case where the planarization insulating film 20 is formed of an organic material, the planarization insulating film 20 can be formed by application, and in a case where the planarization insulating film 20 is formed of an inorganic material, the planarization insulating film 20 can be formed by a CVD method. Thereafter, the color filter layer 27 and the on-chip lens layer 21 are formed in order. The color filter layer 27 is formed for each pixel by forming a film of an organic material having transmission characteristics corresponding to a desired wavelength and performing patterning. Further, the on-chip lens layer 21 is formed by applying an organic material to the entire layer so as to cover the color filter layer 27.

In this embodiment example, since the through-hole 22 has not been formed in the steps of forming the color filter layer 27 and the on-chip lens layer 21, it is possible to prevent application unevenness of an organic material at the time of formation of the color filter layer 27 or the on-chip lens layer 21. In this way, it is possible to evenly form the color filter layer 27 or the on-chip lens layer 21 within the pixel.

In addition, in this step, the surface of the on-chip lens layer 21 is made to be flat and the processing of a lens shape is not performed.

Figure 6:
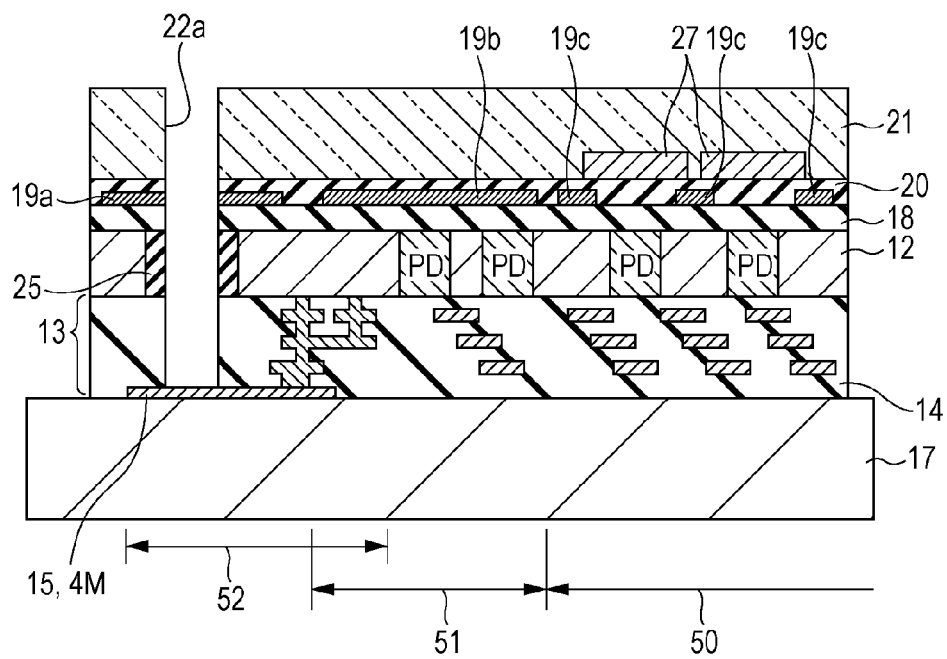
FIG. 6 is a manufacturing process diagram (Part 4) of the solid-state imaging device related to the first embodiment of the present disclosure.

Next, as shown in FIG. 6, the first opening portion 22a which penetrates the on-chip lens layer 21, the pad section base layer 19a, and the substrate 12 in the pad region 52 and exposes the surface electrode pad section 15 formed in the wiring layer 13 is formed by anisotropic etching. In the anisotropic etching, $CF_4/O_2$, $CF_4$, or $SF_6/O_2$ gas can be used, and the gas is changed and used for each material which is etched. For example, $CF_4$-based gas is used in etching of organic material layers such as the wiring layer 13, the insulating film 18, and the on-chip lens layer 21, and $SF_6$-based gas is used in etching of the substrate 12 made of silicon. Here, since the first opening portion 22a is formed such that the surface electrode pad section 15 is exposed at the bottom portion, it is preferable that the surface electrode pad section 15 be formed about 10 μm larger than the diameter of the first opening portion 22a in consideration of even matching misalignment or the like at the time of opening.

Incidentally, as in a solid-state imaging device in the past, in a case where wire bonding is directly performed on the surface electrode pad section, it is necessary to form an opening portion, in which the surface electrode pad section is exposed, so as to have a diameter which allows wire bonding to be performed, and it is necessary to form the diameter of the surface electrode pad section to be about 100 nm. On the other hand, in this embodiment example, since the first opening portion 22a is formed in order to take electrical connection of the surface electrode pad section 15 and the back electrode pad section 24 which will be described later, it is acceptable if the through-electrode layer 23 can be formed inside an opening (inside the through-hole 22), and it is acceptable if the first opening portion 22a has a diameter of at least 3 μm or more. For this reason, it is acceptable if the diameter of the surface electrode pad section 15 is formed to be in a range of 15 μm to 20 μm even if it is formed by taking a margin of about +10 μm with respect to the diameter of the first opening portion 22a.

In this manner, in this embodiment example, it becomes possible to form the diameter of the surface electrode pad section 15 to be more greatly reduced than in a case where wire bonding is performed on the surface electrode pad section. That is, it is possible to reduce the area of the surface electrode pad section 15 in the wiring layer 13.

Figure 7A:
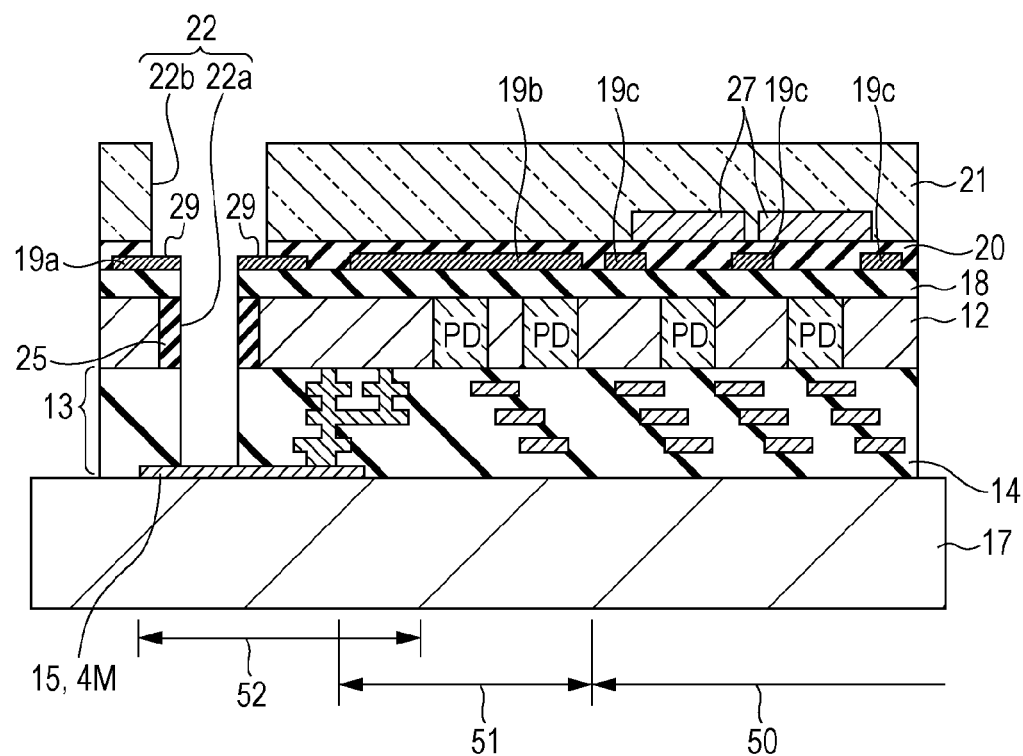
FIGS. 7A and 7B respectively are a manufacturing process diagram (Part 5) of the solid-state imaging device related to the first embodiment of the present disclosure and a plane configuration diagram in a through-hole section in which a first opening portion and a second opening portion are formed.

Next, as shown in FIG. 7A, the second opening portion 22b is formed by removing the on-chip lens layer 21 and the planarization insulation film 20 in an area surrounding the first opening portion 22a by anisotropic etching so as to expose the surface (hereinafter referred to as a terrace portion 29) of a portion of the pad section base layer 19a. In this etching process, in order to remove the planarization insulation film 20 and the on-chip lens layer 21 by etching, for example, $CF_4$-based gas is used.

Figure 7B:
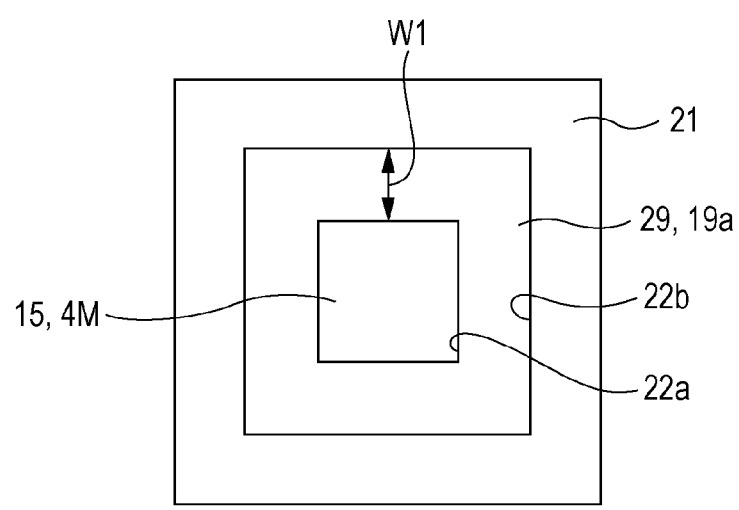

In FIG. 7B, a plane configuration diagram in the through-hole 22 section in which the first opening portion 22a and the second opening portion 22b are formed is shown. As shown in FIG. 7B, the second opening portion 22b is formed larger than the diameter of the first opening portion 22a and smaller than the diameter of the pad section base layer 19a. Then, the width W1 of the terrace portion 29 which is exposed at the bottom portion of the second opening portion 22b by formation of the second opening portion 22b is determined by the difference between the diameters of the second opening portion 22b and the first opening portion 22a. The terrace portion 29 is a portion which becomes a connection portion between the back electrode pad section 24 and the pad section base layer 19a in a later process. Then, since electrical connection of the back electrode pad section 24 and the pad section base layer 19a is accurately made in the terrace portion 29, it is preferable that the width W1 of the terrace portion 29 be formed to be not less than 1 μm and not more than 10 μm.

Figure 8:
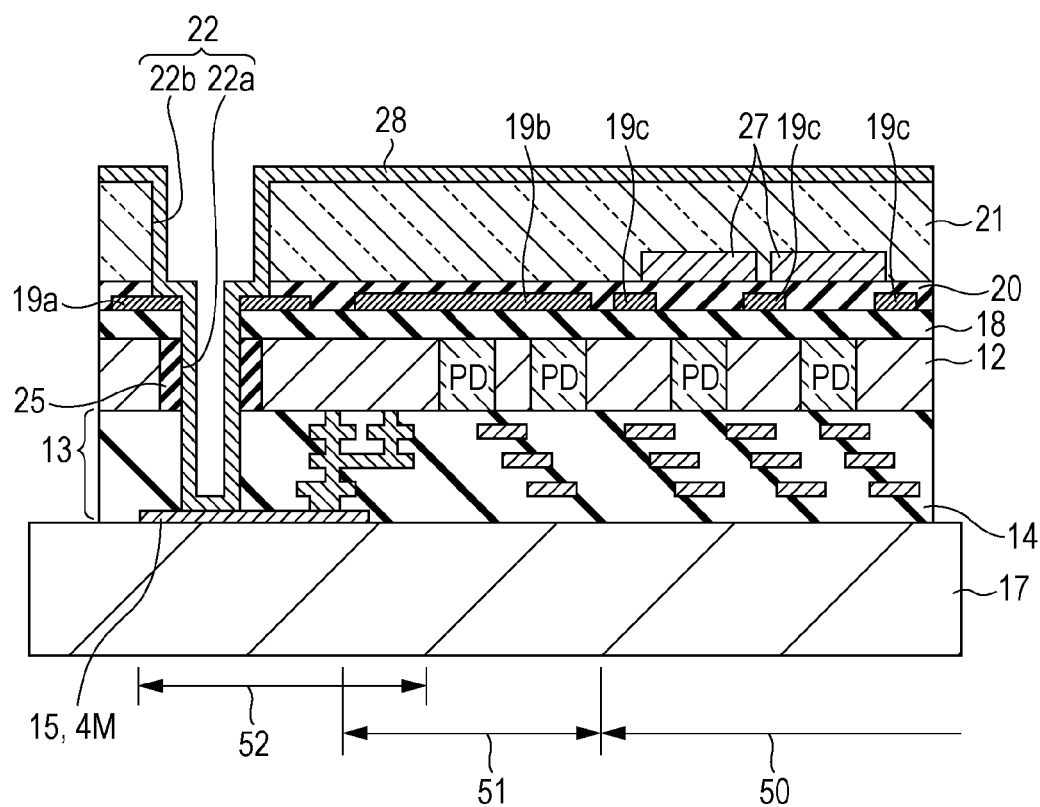
FIG. 8 is a manufacturing process diagram (Part 6) of the solid-state imaging device related to the first embodiment of the present disclosure.

Next, as shown in FIG. 8, an electrode material layer 28 is formed on the entire surface including the inner surface of the through-hole 22 and the upper surface of the on-chip lens layer 21 by using a sputtering method or a CVD method. The electrode material layer 28 which is formed on the on-chip lens layer 21 is for constituting the back electrode pad section 24 and the through-electrode layer 23 in a later process. For this reason, the thickness of the electrode material layer 28 is set to be a necessary and sufficient film thickness for wire bonding. The necessary film thickness for wire bonding is a film thickness necessary for a eutectic reaction of a bonding wire with the back electrode pad section 24, and in a case where the electrode material layer 28 is formed of, for example, Al—Si—Cu-based alloy, it is preferable that the film thickness be 500 nm or more. In this embodiment example, since the electrode material layer 28 is formed by a sputtering method or a CVD method, compared to a case where it is formed using a Cu damascene technique, contamination risk is small and a reduction in cost or improvement in yield can be attained.

Figure 9A:
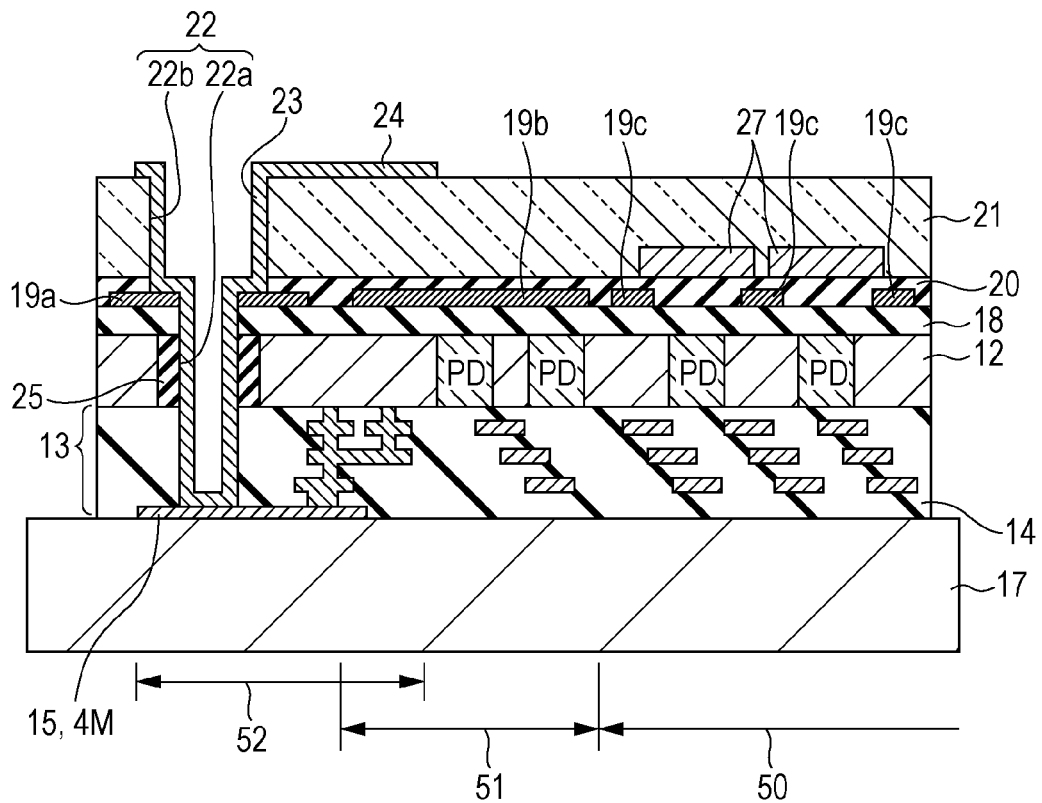
FIGS. 9A and 9B respectively are a manufacturing process diagram of the solid-state imaging device related to the first embodiment of the present disclosure and a plan view illustrating only a back electrode pad section and a through-electrode layer of the solid-state imaging device.
Figure 9B:
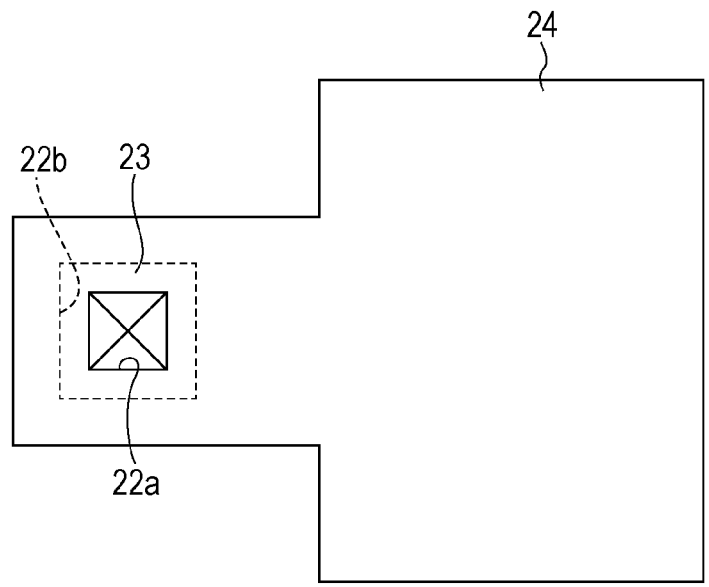

Next, as shown in FIG. 9A, patterning is performed such that the electrode material layer 28 remains only in the pad region 52. In this way, the through-electrode layer 23 is formed in the through-hole 22 and also the back electrode pad section 24 is formed above the on-chip lens layer 21 of the pad region 52. FIG. 9B is a plan view showing only the back electrode pad section 24 and the through-electrode layer 23. The back electrode pad section 24 is formed to have a necessary area for wire bonding. Then, in this embodiment example, since the back electrode pad section 24 is formed at the topmost layer which becomes the light incidence side, the back electrode pad section 24 can be freely disposed without being affected by the wiring layer 13. For this reason, a reduction in chip area can be attained. Further, in this embodiment example, the back electrode pad section 24 is disposed to extend up to the optical black region 51. For this reason, it is possible to further improve a light-shielding effect in the optical black region 51.

Further, scattering materials are generated at the time of pattern processing of the back electrode pad section 24. However, in this embodiment example, since the on-chip lens layer 21 has not been yet processed into a lens shape in the effective pixel region 50, compared to a case where a lens shape has been processed, the scattering materials are easily removed. For this reason, it is possible to reduce a defect due to the scattering materials which are generated at the time of pattern processing of the back electrode pad section 24.

Further, in this embodiment example, since the terrace portion 29 formed such that the pad section base layer 19a is exposed within the through-hole 22 is formed, electrical connection of the through-electrode layer 23 and the pad section base layer 19a is excellently made at the terrace portion 29.

Then, after formation of the back electrode pad section 24, by forming a concavo-convex shape in the surface of the on-chip lens layer 21 in the effective pixel region 50, the on-chip lenses 21a are formed. At this time, in the pad region 52, since the electrode material layer 28 (the back electrode pad section 24) is formed on the on-chip lens layer 21 and the back electrode pad section 24 serves as a mask, the on-chip lens layer 21 is not processed.

In doing as described above, the solid-state imaging device shown in FIG. 2 is completed.

In this embodiment example, since the processing of the shape of the on-chip lens 21a is performed after formation of the back electrode pad section 24 or formation of the through-electrode layer 23, it is possible to process the on-chip lens 21a into a predetermined shape without depending on the processing conditions of the back electrode pad section 24 or the like. Further, since the on-chip lens layer 21 is formed before formation of the through-hole 22, application unevenness due to the influence of a step or the like is reduced, so that it is possible to reduce in-plane unevenness of the on-chip lens 21a. Further, since the processing of the on-chip lens 21a is performed after formation of the back electrode pad section 24, retention of scattering metal, collapse of the shape of the on-chip lens 21a, or the like, which may occur at the time of formation of the back electrode pad section 24, does not occur.

In this embodiment example, it is possible to perform connection to an external terminal by connecting a bonding wire onto the back electrode pad section 24. In this embodiment example, since the back electrode pad section 24 can be disposed at the topmost layer, it is possible to easily perform bonding, so that it is possible to improve an assembly yield.

Further, in this embodiment example, the pad section base layer 19a, the invalid pixel light-shielding film 19b, and the inter-pixel light-shielding film 19c are electrically connected to each other and also the pad section base layer 19a is electrically connected to the back electrode pad section 24. Accordingly, in a case where, for example, a ground wiring is connected to the back electrode pad section 24, a ground electric potential is supplied to the surface electrode pad section 15 and a ground electric potential is also supplied to the invalid pixel light-shielding film 19b and the inter-pixel light-shielding film 19c, so that an electric potential is stably retained. Further, since the terrace portion 29 is formed, electrical connection of the through-electrode layer 23 and the pad section base layer 19a is also excellently made.

As described above, in the method of manufacturing the solid-state imaging device 1 of this embodiment example, the on-chip lens layer 21 is formed before formation of the through-hole 22 and the processing of the shape of the on-chip lens 21a is performed after formation of the through-hole 22, the through-electrode layer 23, and the back electrode pad section 24. Accordingly, attachment of scattering materials to the upper portion of the on-chip lens 21a or collapse of the shape of the on-chip lens 21a is reduced and variation in light condensing characteristic can be reduced. Then, according to the method of manufacturing the solid-state imaging device 1 of this embodiment example, the shape of the on-chip lens 21a can be formed without variation in a plane and also the surface electrode pad section 15 can be electrically connected to the back electrode pad section 24.

In the solid-state imaging device 1 of this embodiment example, an example has been taken in which the pad section base layer 19a, the invalid pixel light-shielding film 19b, and the inter-pixel light-shielding film 19c are formed to be electrically connected to each other. However, they may also be formed to be separated from each other and the configuration thereof can be variously selected. Hereinafter, an example in which the pad section base layer 19a is formed to be electrically separated from the invalid pixel light-shielding film 19b and the inter-pixel light-shielding film 19c will be described.

2. Second Embodiment

Figure 10A:
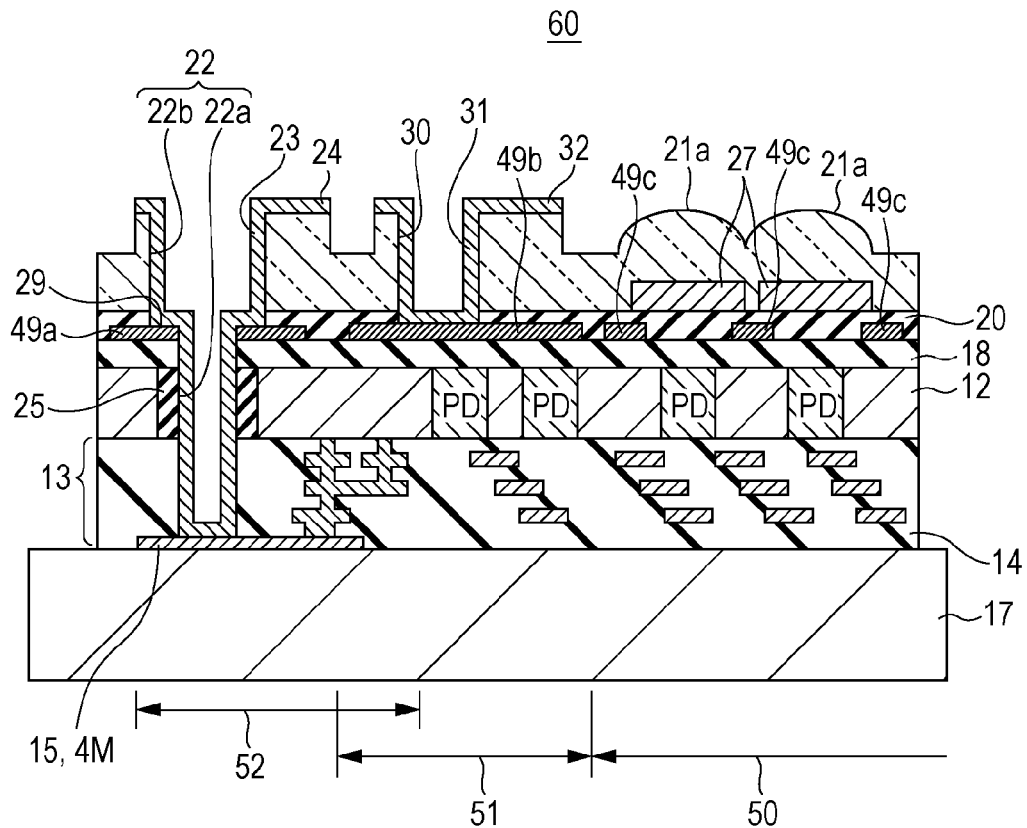
FIGS. 10A and 10B respectively are a cross-sectional configuration diagram of the main section of a solid-state imaging device related to a second embodiment of the present disclosure and a plane configuration diagram illustrating a pad section base layer, an invalid pixel light-shielding film, and an inter-pixel light-shielding film of the solid-state imaging device.

In FIG. 10A, a cross-sectional configuration of the main section of a solid-state imaging device related to the second embodiment of the present disclosure is shown. Since the overall configuration of the solid-state imaging device of this embodiment example is the same as FIG. 1, repeated explanation is omitted. Further, in FIG. 10A, the same reference numerals are applied to portions corresponding to those in FIG. 2 and repeated explanation is omitted.

A solid-state imaging device 60 of this embodiment example is an example in which a separate pad section for a light-shielding film 32 from the back electrode pad section 24 is provided on an invalid pixel light-shielding film 49b constituting the optical black region 51, as shown in FIG. 10A.

Figure 10B:
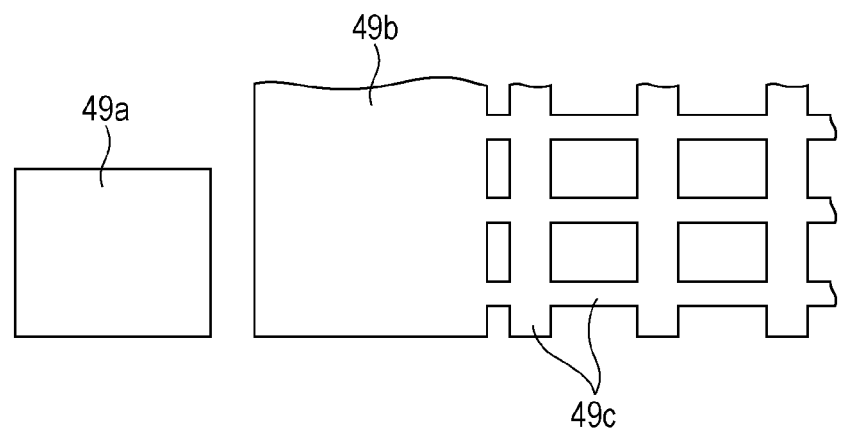

FIG. 10B is a plane configuration diagram illustrating a pad section base layer 49a, the invalid pixel light-shielding film 49b, and an inter-pixel light-shielding film 49c in the solid-state imaging device 60 of this embodiment example. At the time of completion, the first opening portion 22a is formed in the pad section base layer 49a. However, in FIG. 10B, the pad section base layer 49a is shown corresponding to FIG. 4B in the first embodiment. In this embodiment example, the invalid pixel light-shielding film 49b and the inter-pixel light-shielding film 49c are electrically connected to each other. However, the pad section base layer 49a is not electrically connected to the invalid pixel light-shielding film 49b and the inter-pixel light-shielding film 49c. In this manner, in a case where the pad section base layer 49a is not electrically connected to the invalid pixel light-shielding film 49b and the inter-pixel light-shielding film 49c, it is necessary to separately supply voltage to the invalid pixel light-shielding film 49b.

In the solid-state imaging device 60 of this embodiment example, as shown in FIG. 10A, an opening portion 30 which exposes the invalid pixel light-shielding film 49b is formed above the invalid pixel light-shielding film 49b. Then, an electrode layer 31 is formed on the bottom portion and the side wall of the opening portion 30 and the pad section for a light-shielding film 32 formed continuously with the electrode layer 31 is formed on the on-chip lens layer 21. That is, in this embodiment example, the invalid pixel light-shielding film 49b is electrically connected to the pad section for a light-shielding film 32 through the electrode layer 31. Further, the pad section for a light-shielding film 32 is formed to be separated from the back electrode pad section 24 and the pad section for a light-shielding film 32 is used as a bonding pad to an external terminal.

As shown in FIG. 10B, in a case where the pad section base layer 49a is not electrically connected to the invalid pixel light-shielding film 49b and the inter-pixel light-shielding film 49c, as in this embodiment example, the pad section for a light-shielding film 32 which is connected to the invalid pixel light-shielding film 49b is formed. In this way, it is possible to supply a given voltage to the invalid pixel light-shielding film 49b and the inter-pixel light-shielding film 49c and it is possible to stably maintain the electric potential of the invalid pixel light-shielding film 49b and the inter-pixel light-shielding film 49c.

Figure 11:
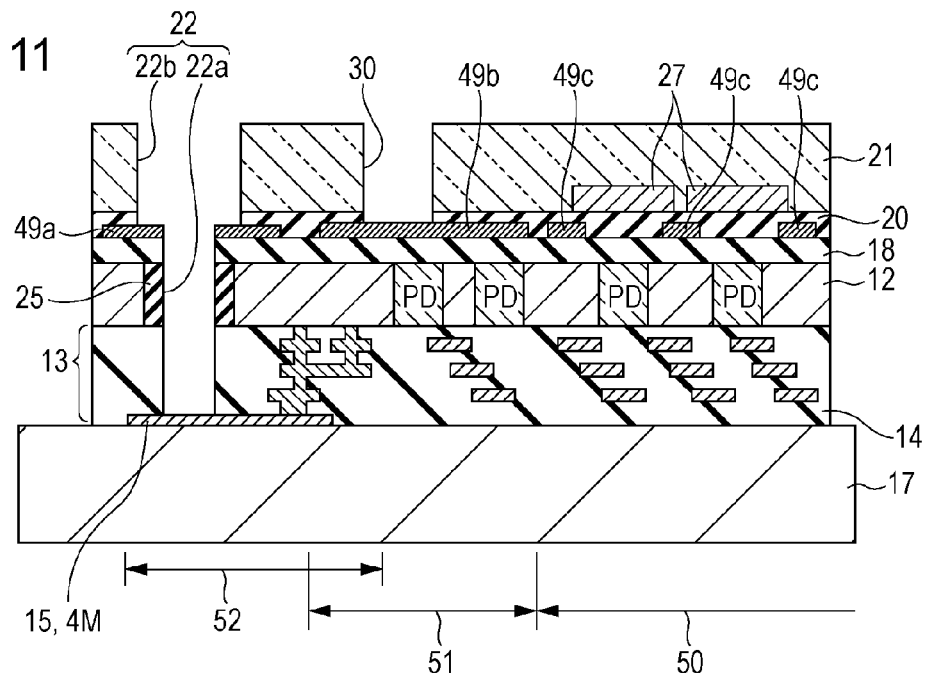
FIG. 11 is a cross-sectional configuration diagram illustrating a manufacturing process of the solid-state imaging device related to the second embodiment of the present disclosure.

FIG. 11 is a manufacturing process diagram of the solid-state imaging device 60 of this embodiment example. Here, a description will be given only with respect to a process different from the manufacturing process in the first embodiment. In this embodiment example, after the process of FIG. 6 in the first embodiment example, as shown in FIG. 11, the opening portion 30 which exposes the invalid pixel light-shielding film 49b is formed at the same time as formation of the second opening portion 22b. Thereafter, the electrode layer 31 and the pad section for a light-shielding film 32 are formed at the same time as formation of the through-electrode layer 23 and the back electrode pad section 24. Since other processes are the same as those in the first embodiment, repeated explanation is omitted.

This embodiment example can be applied, for example, in a case where the pad section base layer 49a is used as a ground wiring and the invalid pixel light-shielding film 49b is fixed to a negative electric potential. In this case, since the pad section base layer 49a plays the role of a guard ring, it is electrically connected to the surface electrode pad section 15 in the terrace portion 29.

As in this embodiment example, also in a case where the pad section for a light-shielding film 32 is provided separately from the back electrode pad section 24, it is possible to process the shape of the on-chip lens 21a after formation of the pad section for a light-shielding film 32. For this reason, it is possible to reduce variation in the light condensing characteristic of the on-chip lens 21a. Besides, the same effects as those in the first embodiment can be obtained.

3. Third Embodiment

Figure 12:
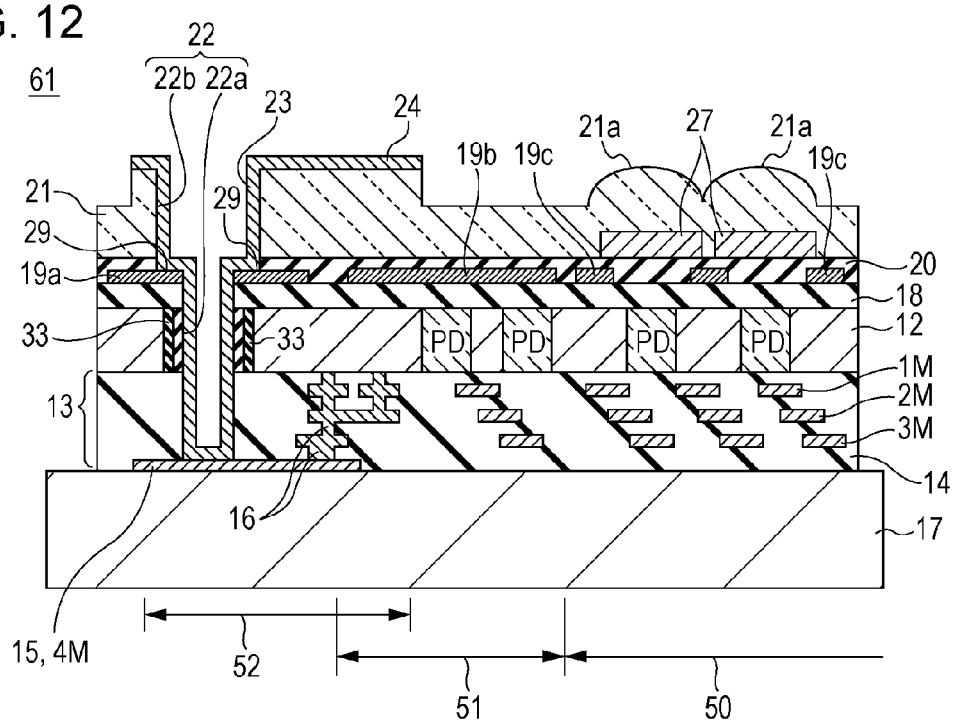
FIG. 12 is a cross-sectional configuration diagram of the main section of a solid-state imaging device related to a third embodiment of the present disclosure.

In FIG. 12, a cross-sectional configuration of the main section of a solid-state imaging device related to the third embodiment of the present disclosure is illustrated. Since the overall configuration of a solid-state imaging device 61 of this embodiment example is the same as FIG. 1, repeated explanation is omitted. Further, in FIG. 12, the same reference numerals are applied to portions corresponding to those in FIG. 2 and repeated explanation is omitted.

The solid-state imaging device 61 of this embodiment example is an example in which insulation between the through-electrode layer 23 and the substrate 12 is performed by an insulating layer 33 formed by embedding an insulating material in the substrate 12.

As shown in FIG. 12, in the solid-state imaging device 61 of this embodiment example, the insulating layer 33 is formed in the substrate 12 so as to surround the first opening portion 22a. The insulating layer 33 can be formed by forming an opening so as to penetrate the substrate 12 and embedding, for example, an insulating material such as a silicon oxide film in the opening, before formation of the insulating film 18.

Further, in this embodiment example, it is preferable that the insulating layer 33 be formed at a position directly below the terrace portion 29 and formed into a shape falling within the area of the terrace portion 29. In this way, it is possible to minimize a necessary area for the insulating layer 33.

In this embodiment example, insulation between the through-electrode layer 23 and the substrate 12 is maintained by the insulating layer formed so as to surround the through-hole 22.

Then, also in this embodiment example, the same effects as those in the first embodiment can be obtained.

4. Fourth Embodiment

Figure 13:
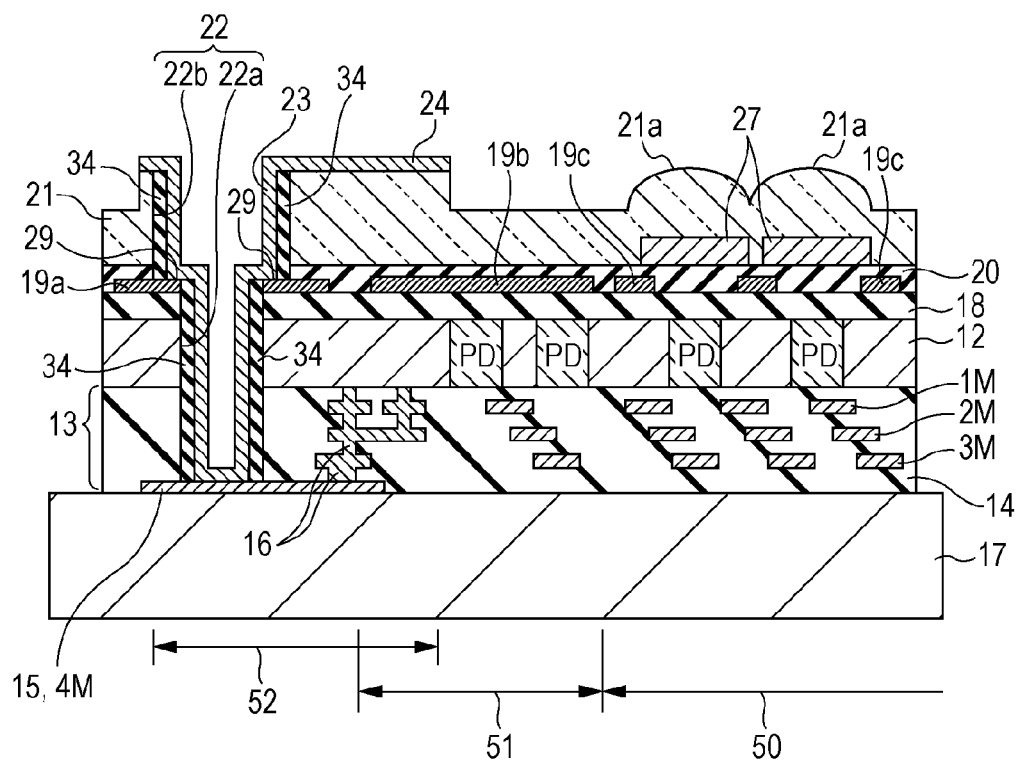
FIG. 13 is a cross-sectional configuration diagram of the main section of a solid-state imaging device related to a fourth embodiment of the present disclosure.

In FIG. 13, a cross-sectional configuration of the main section of a solid-state imaging device related to the fourth embodiment of the present disclosure is illustrated. Since the overall configuration of a solid-state imaging device 62 of this embodiment example is the same as FIG. 1, repeated explanation is omitted. Further, in FIG. 13, the same reference numerals are applied to portions corresponding to those in FIG. 2 and repeated explanation is omitted.

The solid-state imaging device 62 of this embodiment example is an example in which insulation between the through-electrode layer 23 and the substrate 12 is performed by an insulating film 34 formed on the side wall of the through-hole 22.

As shown in FIG. 13, in the solid-state imaging device 62 of this embodiment example, the insulating film 34 made of a silicon oxide film is formed on the side walls of the first opening portion 22a and the second opening portion 22b. Then, the through-electrode layer 23 is formed in the first opening portion 22a and the second opening portion 22b which include the insulating film 34.

Figure 14A:
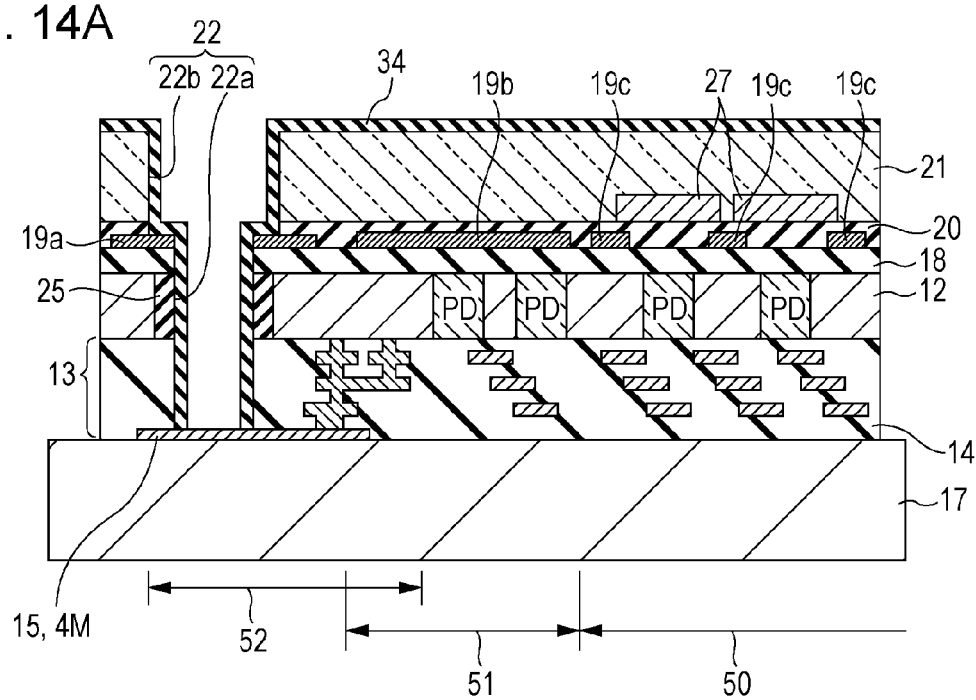
FIGS. 14A and 14B are manufacturing process diagrams (Parts 1 and 2) of the solid-state imaging device related to the fourth embodiment of the present disclosure.
Figure 14B:
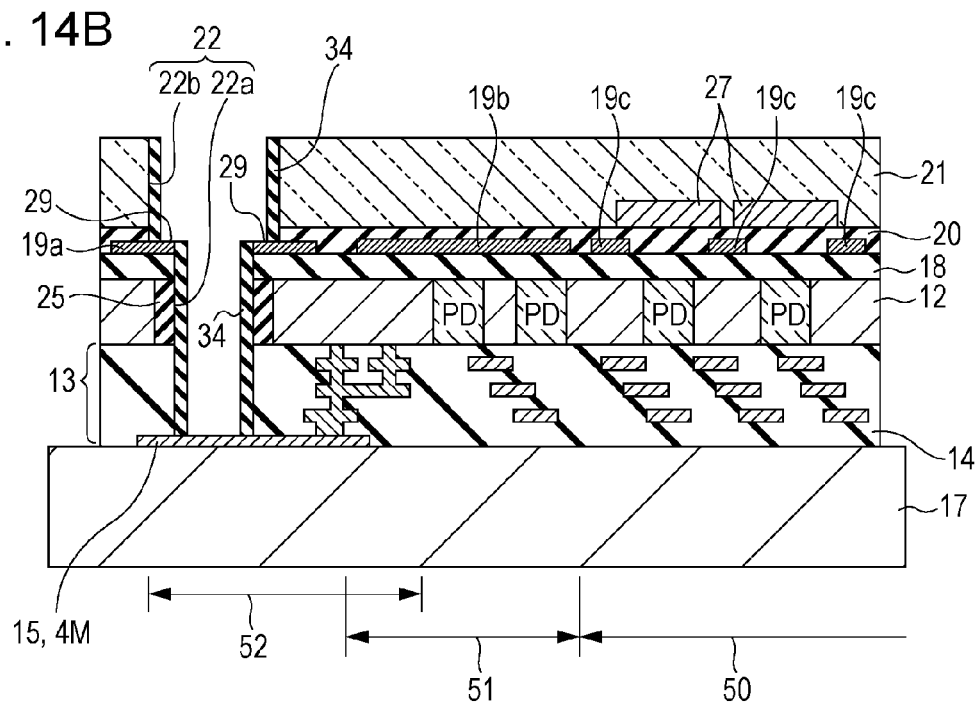

FIGS. 14A and 14B are diagrams illustrating a manufacturing process of the solid-state imaging device 62 of this embodiment example. Here, a description will be given only with respect to a process different from the manufacturing process in the first embodiment. In this embodiment example, after the through-hole 22 is formed as in FIG. 7A in the first embodiment example, as shown in FIG. 14A, the insulating film 34 made of $SiO_2$ is formed on the entire surface including the inner surface of the through-hole 22 and the upper surface of the on-chip lens layer 21 by a P-CVD method or a CVD method. By using a P-CVD method or a CVD method, it is possible to form the insulating film 34 in the through-hole 22 with good coverage.

By performing etch-back after film formation of the insulating film 34, as shown in FIG. 14B, an unnecessary portion such as the insulating film 34 of the bottom portion of the first opening portion 22a or the insulating film 34 of the bottom portion (the terrace portion 29) of the second opening portion 22b is removed. Thereafter, in the same way as the first embodiment, the solid-state imaging device 62 of this embodiment example can be formed.

In this embodiment example, since the substrate 12 exposed by the first opening portion 22a is covered by the insulating film 34, it is possible to prevent the through-electrode layer 23 which is formed in the first opening portion 22a and the substrate 12 from being electrically connected to each other.

Then, also in this embodiment example, the same effects as those in the first embodiment can be obtained.

5. Fifth Embodiment

Figure 15:
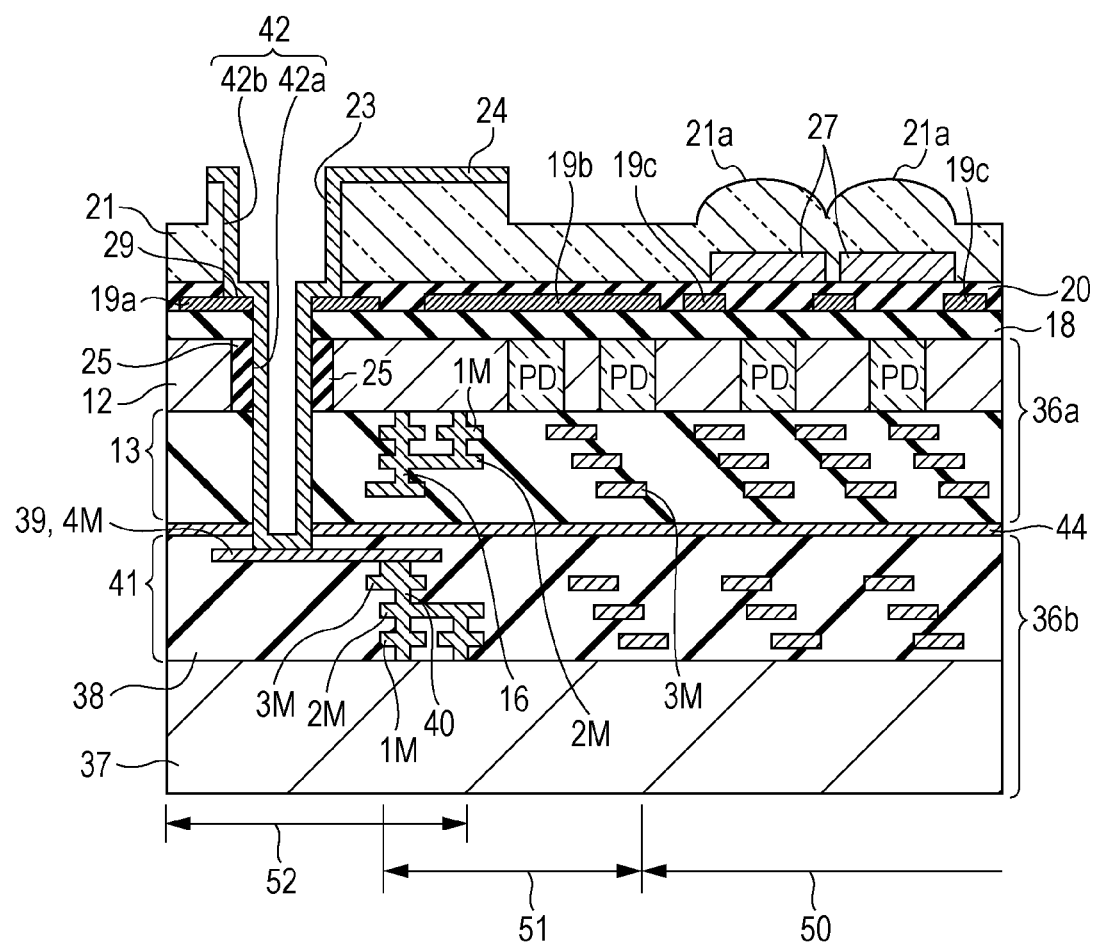
FIG. 15 is a cross-sectional configuration diagram of the main section of a solid-state imaging device related to a fifth embodiment of the present disclosure.

In FIG. 15, a cross-sectional configuration of the main section of a solid-state imaging device related to the fifth embodiment of the present disclosure is illustrated. A solid-state imaging device 63 of this embodiment example is made to have a configuration in which the imaging region 3 and the peripheral circuit region are formed in separate substrates and the respective substrates are laminated. That is, the solid-state imaging device 63 of this embodiment example is an example in which the imaging region 3 of the solid-state imaging device 1 of FIG. 1 is formed in an upper layer section which becomes the light incidence side and the peripheral circuits such as the vertical drive circuit 4, the column signal processing circuit 5, the horizontal drive circuit 6, and the control circuit 8 are formed in a lower layer section. In FIG. 15, the same reference numerals are applied to portions corresponding to those in FIG. 2 and repeated explanation is omitted.

In the solid-state imaging device 63 of this embodiment example, a lower layer section 36b is constituted by a substrate 37 and a wiring layer 41 formed on the substrate 37. In the lower layer section 36b, a plurality of transistors for driving the peripheral circuits are formed. However, illustration of these transistors is omitted. Further, in the wiring layer 41 of the lower layer section 36b, wirings 1M to 4M of plural layers (in FIG. 15, four layers) are formed with an interlayer insulating film 38 interposed therebetween. Then, in the pad region 52, a surface electrode pad section 39 is formed by the wiring 4M of the topmost layer.

Further, an upper layer section 36a is made to have the same configuration as that in the solid-state imaging device 1 of the first embodiment. However, in this embodiment example, the surface electrode pad section is not formed in the wiring layer 13 of the upper layer section 36a. The wiring layers 13 and 41 of the upper layer section 36a and the lower layer section 36b are bonded to each other through an adhesive layer 44, whereby the upper layer section 36a and the lower layer section 36b are laminated. Then, a through-hole 42 formed from the upper layer section 36a side is formed so as to reach the surface electrode pad section 39 formed in the lower layer section 36b, and in the through-hole 42, a through-electrode layer 43 electrically connecting the surface electrode pad section 39 to the back electrode pad section 24 is formed.

In a method of manufacturing the solid-state imaging device 63 of this embodiment example, the upper layer section 36a formed up to the process of FIG. 5 of the first embodiment example and the lower layer section 36b in which the transistors constituting the peripheral circuits or the wiring layer 41 is formed are adhered to each other through the adhesive layer 44 such that the wiring layers 13 and 41 are laminated. Thereafter, a first opening portion 42a which reaches the surface electrode pad section 39 of the lower layer section 36b is formed from the back side of the upper layer section 36a. Thereafter, in the same way as the first embodiment, a second opening portion 42b is formed, so that the through-hole 42 is formed.

Then, after the through-hole 42 is formed, the through-electrode layer 23, the back electrode pad section 24, and the on-chip lens 21a are formed in the same way as the processes of FIGS. 8 and 9 of the first embodiment. In this way, the solid-state imaging device 63 of this embodiment example is completed.

In this manner, also in the case of having a configuration in which the substrates of plural layers (in this embodiment example, two layers) are laminated, the on-chip lens layer 21 can be formed before formation of the through-hole 42 and the shape of the on-chip lens 21a can be processed after formation of the through-electrode layer 23. For this reason, it is possible to reduce variation in light condensing characteristic of the on-chip lens 21a. Besides, the same effects as those in the first embodiment can be obtained.

The present disclosure is not limited to application to a solid-state imaging device which detects the distribution of the amount of incident light of visible light and captures it as an image, but it is also applicable to a solid-state imaging device which captures the distribution of the amount of incidence of infrared rays, X-ray, particles, or the like as an image. Further, in a broad sense, the present disclosure is applicable to a solid-state imaging device (a physical quantity distribution detection device) in general such as a fingerprint detection sensor, which detects the distribution of another physical quantity such as pressure or electrostatic capacity and captures it as an image.

Further, the present disclosure is not limited to a solid-state imaging device which reads out a pixel signal from each unit pixel by scanning in order each unit pixel of a pixel section in a row unit. The present disclosure is also applicable to an X-Y address type solid-state imaging device which selects an arbitrary pixel in a pixel unit and reads out a signal in a pixel unit from the selected pixel.

In addition, the solid-state imaging device may also be a form in which it is formed as one-chip and may also be a module-like form having an imaging function, in which a pixel section and a signal processing section or an optical system are packaged together.

Further, the present disclosure is not limited to application to the solid-state imaging device and is also applicable to an imaging device. Here, the imaging device means a camera system such as a digital still camera or a video camera, or electronic equipment having an imaging function, such as a mobile telephone. In addition, there is also a case where the above module-like form which is mounted in electronic equipment, that is, a camera module is set to be an imaging device.

6. Sixth Embodiment

Electronic Equipment

Figure 16:
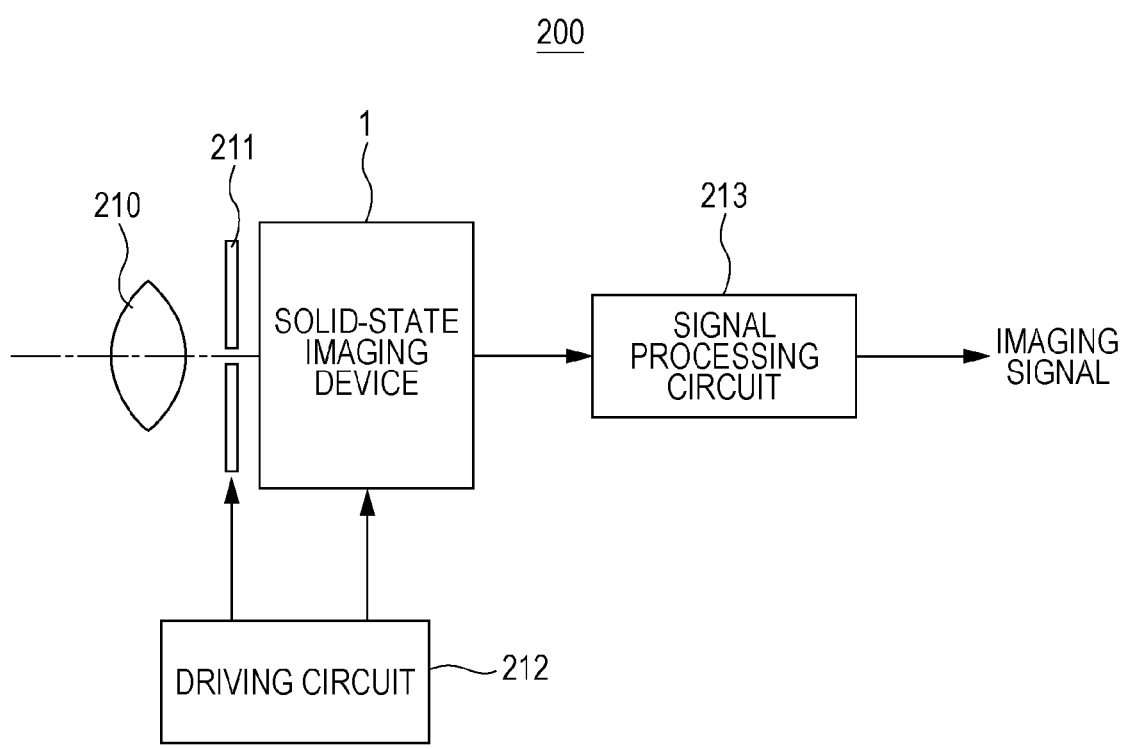
FIG. 16 is a schematic cross-sectional configuration diagram of electronic equipment related to a sixth embodiment of the present disclosure.

Next, electronic equipment related to the sixth embodiment of the present disclosure will be described. FIG. 16 is a schematic configuration diagram of electronic equipment 200 related to the sixth embodiment of the present disclosure.

The electronic equipment 200 of this embodiment example represents an embodiment in a case where the solid-state imaging device 1 in the first embodiment of the present disclosure described above is used in electronic equipment (a camera).

The electronic equipment 200 related to this embodiment includes the solid-state imaging device 1, an optical lens 210, a shutter device 211, a driving circuit 212, and a signal processing circuit 213.

The optical lens 210 images image light (incident light) from a subject on an imaging area of the solid-state imaging device 1. In this way, a relevant signal charge is accumulated in the solid-state imaging device 1 for a certain period of time.

The shutter device 211 controls a light irradiation period to the solid-state imaging device 1 and a light-shielding period.

The driving circuit 212 supplies a driving signal which controls a transmission operation of the solid-state imaging device 1 and a shutter operation of the shutter device 211. Signal transmission of the solid-state imaging device 1 is performed by the driving signal (a timing signal) which is supplied from the driving circuit 212. The signal processing circuit 213 performs various signal processing. A video signal on which the signal processing has been performed is stored in a storage medium such as a memory or is output to a monitor.

In the electronic equipment 200 of this embodiment example, since in the solid-state imaging device 1, variation in the light condensing characteristic of the on-chip lens is reduced, improvement in image quality can be attained.

As the electronic equipment 200 to which the solid-state imaging device 1 can be applied, it is not limited to a camera and is applicable to a digital still camera and an imaging device such as a camera module for mobile equipment such as a mobile telephone.

In this embodiment example, a configuration has been taken in which the solid-state imaging device 1 is used in electronic equipment. However, it is also possible to use the solid-state imaging devices manufactured in the second to fifth embodiments described above.

The present disclosure contains subject matter related to that disclosed in Japanese Priority Patent Application JP 2010-229753 filed in the Japan Patent Office on Oct. 12, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
substrate in which a plurality of pixels including a photoelectric conversion section are formed, the substrate having a rear side and a back side;
a wiring layer formed on the front side of the substrate;
a surface electrode pad section formed in the wiring layer;
a light-shielding film formed on the rear side of the substrate;
a pad section base layer formed in the same layer as the light-shielding film;
an on-chip lens layer formed over the light-shielding film and the pad section base layer at the rear side of the substrate;
a back electrode pad section formed above the on-chip lens layer;
a through-hole formed to penetrate the on-chip lens layer, the pad section base layer, and the substrate so that the surface electrode pad section is exposed; and
a through-electrode layer which is formed in the through-hole and connects the surface electrode pad section and the back electrode pad section,
wherein,
the light-shielding film includes an inter-pixel light-shielding film which shields between adjacent pixels, and an invalid pixel light-shielding film for shielding an invalid pixel region among the plurality of pixels.

2. The solid-state imaging device according to claim 1, wherein the through-electrode layer electrically connects the surface electrode pad section, the back electrode pad section, and the pad section base layer.

3. The solid-state imaging device according to claim 1, wherein the inter-pixel light-shielding film and the invalid pixel light-shielding film are electrically connected to each other.

4. The solid-state imaging device according to claim 3, wherein the inter-pixel light-shielding film, the invalid pixel region, and the pad section base layer are electrically connected to each other.

5. The solid-state imaging device according to claim 1, wherein the through-hole includes a first opening portion formed such that the surface electrode pad section is exposed to the light incidence side, and a second opening portion formed to have a larger diameter than the first opening portion and formed such that the pad section base layer is exposed to the light incidence side.

6. The solid-state imaging device according to claim 1, wherein the back electrode pad section is formed so as to extend up above the invalid pixel light-shielding film.

7. An electronic equipment comprising:
an optical lens;
a solid-state imaging device which includes a substrate in which a plurality of pixels which are each provided with a photoelectric conversion section that produces a signal charge according to an amount of received light is formed, a wiring layer formed on a front side of the substrate, a surface electrode pad section formed in the wiring layer, a light-shielding film formed on a back side of the substrate, a pad section base layer formed in the same layer as the light-shielding film, an on-chip lens layer formed at a back side of the substrate on a light incidence side of an upper layer of the light-shielding film and the pad section base layer, a back electrode pad section formed above the on-chip lens layer, a through-hole formed to penetrate the on-chip lens layer, the pad section base layer, and the substrate so that the surface electrode pad section is exposed, and an electrode layer which connects the surface electrode pad section and the back electrode pad section through the through-hole, and on which light condensed by the optical lens is incident; and
a signal processing circuit which processes an output signal that is output from the solid-state imaging device,
wherein,
the light-shielding film includes an inter-pixel light-shielding film which shields between adjacent pixels, and an invalid pixel light-shielding film for shielding an invalid pixel region among the plurality of pixels.

8. The electronic equipment according to claim 7, wherein the through-electrode layer electrically connects the surface electrode pad section, the back electrode pad section, and the pad section base layer.

9. The electronic equipment according to claim 7, wherein the inter-pixel light-shielding film and the invalid pixel light-shielding film are electrically connected to each other.

10. The electronic equipment according to claim 9, wherein the inter-pixel light-shielding film, the invalid pixel region, and the pad section base layer are electrically connected to each other.

11. The electronic equipment according to claim 7, wherein the through-hole includes a first opening portion formed such that the surface electrode pad section is exposed to the light incidence side, and a second opening portion formed to have a larger diameter than the first opening portion and formed such that the pad section base layer is exposed to the light incidence side.

12. The electronic equipment according to claim 7, wherein the back electrode pad section is formed so as to extend up above the invalid pixel light-shielding film.

* * * * *